United States Patent
Protzman et al.

(10) Patent No.: US 6,687,176 B2
(45) Date of Patent: Feb. 3, 2004

(54) FIRST BIT DATABURST FIRING OF IO EQUILIBRATING ENDING SIGNAL BASED ON COLUMN ACCESS SIGNAL

(75) Inventors: Brendan N. Protzman, Boise, ID (US); Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/284,928

(22) Filed: Oct. 31, 2002

(65) Prior Publication Data

US 2003/0076720 A1 Apr. 24, 2003

Related U.S. Application Data

(60) Continuation of application No. 10/126,413, filed on Apr. 19, 2002, now Pat. No. 6,483,762, which is a division of application No. 09/867,734, filed on May 30, 2001, now Pat. No. 6,501,688.

(51) Int. Cl.[7] .................................................. G11C 7/00
(52) U.S. Cl. .............. 365/203; 365/189.05; 365/189.01
(58) Field of Search ........................... 365/203, 189.05, 365/189.01, 233, 190, 191

(56) References Cited

U.S. PATENT DOCUMENTS

| | | | |
|---|---|---|---|
| 5,416,743 A | * 5/1995 | Allan et al. ................. | 365/203 |
| 5,544,124 A | 8/1996 | Zagar et al. ............ | 365/230.08 |
| 5,751,656 A | 5/1998 | Schaefer ................... | 365/233.5 |
| 5,815,432 A | 9/1998 | Naffziger et al. ........... | 365/154 |
| 5,835,440 A | 11/1998 | Manning ............... | 365/230.06 |
| 5,959,936 A | 9/1999 | Seo et al. ..................... | 365/233 |
| 5,963,493 A | 10/1999 | Merritt et al. .............. | 365/203 |
| 5,966,724 A | 10/1999 | Ryan .......................... | 711/105 |
| 5,986,955 A | 11/1999 | Siek et al. ................... | 365/203 |
| 6,023,429 A | 2/2000 | Mecier et al. .............. | 365/194 |
| 6,055,654 A | 4/2000 | Martin ........................ | 714/719 |
| 6,154,401 A | 11/2000 | Casper et al. ............... | 365/202 |
| 6,356,492 B1 | 3/2002 | Raad .......................... | 365/202 |
| 2002/0181294 A1 | * 12/2002 | Protzman et al. ........... | 365/191 |

* cited by examiner

*Primary Examiner*—David Lam
(74) *Attorney, Agent, or Firm*—Whyte Hirschboeck Dudek SC

(57) ABSTRACT

A method and apparatus for improving time between row address latching and column address latching (tRCD) by allowing the pull-up of the IO lines during a READ burst to end upon the firing of a column access signal rather than waiting for the next clock signal of the READ operation. A latch is set during the active command in order to set a node voltage which allows the IO pull-up signal to end upon the firing of the column access signal. The invention allows improvement in tRCD parameter, and allows digit line pairs to separate without unwanted line sharing with the IO lines prior to reading of the first bit of a data burst. The result is a more accurate and error-free read of a first bit of data during a READ sequence.

19 Claims, 5 Drawing Sheets

FIRST BIT DATABURST FIRING OF IO EQUILIBRATING ENDING SIGNAL BASED ON COLUMN ACCESS SIGNAL

This application is a continuation of U.S. patent application Ser. No. 10/126,413, filed Apr. 19, 2002, now U.S. Pat. No. 6,483,762, which is a division of U.S. patent application Ser. No. 09/867,734, filed May 30, 2001, now U.S. Pat. No. 6,501, 688.

BACKGROUND OF THE INVENTION

The present invention relates generally to memory devices, such as DRAMs. More particularly, the present invention relates to improving the parameter measured from an active command to the READ/WRITE command (tRCD) in a DRAM.

Dynamically refreshable random access memory (DRAM) is currently highly utilized for providing rapid data storage and retrieval in computerized equipment at a reasonable cost. DRAM technology is evolving rapidly. One emergence in the DRAM field is the use of synchronous operation of the DRAM control circuitry. Integrated circuit memory devices such as synchronous dynamic random access memory devices (SDRAMs) have thousands of memory cells. Each memory cell is capable of storing data in the form of an electric charge. In order to read the data in a particular memory cell, the memory cell is selectively coupled to a sense circuit via a communication line, commonly referred to as a digit line. Typically, the sense circuit is connected to a pair of digit lines and detects a voltage differential between the digit lines caused by the stored charge. Prior to coupling a memory cell to a digit line, the pair of digit lines are equilibrated to a predetermined voltage level such as VCC/2. After the sense circuit amplifies the voltage differential on the pair of digit lines, the digit lines are coupled to data input/output (IO) communication lines for data communication with external devices. In order to accelerate the read operation, and to minimize operational power consumption, the IO lines of the SDRAM are typically equilibrated and pre-charged to an initial predetermined voltage, VCC. This allows the IO lines to quickly develop a differential voltage when coupled to the amplified digit lines.

Standard synchronous DRAMs latch and decode a row address when a row address strobe is fired via an active command and then will latch and decode the column address when column address strobe is fired via the READ/WRITE command. A critical parameter is tRCD. Parameter tRCD is measured from the ACTIVE command to when the column address is available during the READ/WRITE operation. The need always exists for minimizing the time required for a memory access, and if the time between the row address latching and the column address latching (tRCD) is reduced or optimized, without effecting system operation, the memory access time of the system can be reduced.

One problem that exists is that during the first bit of a read burst, if the digit lines are not able to reach enough of a separation before being passed onto the I/O lines, the first bit can fail, since the requisite differential voltage is not present. FIG. 2 is a graph showing signal wave forms for various signals within a typical SDRAM during an access that demonstrate one of the problems associated with digit line separation during an initial READ/WRITE operation. As shown in FIG. 2, digit line pair as represented by digit line 50 (DIG) and digit line 52 (DIG*) are pre-charged to a voltage level 54 which represents approximately halfway between voltage level 56 (ground) and voltage level 58 (source voltage Vcc). Both IO lines 60 and 62 are initially pulled high, but upon IOPU signal 64 being forced off, IO line 60 is being driven high by digit line 50 and IO signal 62 is being driven low by digit line 52. However, in the region indicated by 66, IO signal 62 is still being pulled high via IOPU. Digit line 52 is drawn towards voltage level 58 at a time when it should be driven towards voltage level 56. Therefore, a spike occurs in region 66 for digit line 52, thereby decreasing charge separation of the digit pair and increasing the time before the digit lines are able to be accurately read and ultimately reach full rail separation. While IOPU is on, GCOL fires, which passes the digit voltage onto the IO lines. Since the IO lines are still actively being pulled high and the pass gate (GCOL) is on, this pulls up digit line 52. At this time, when digit separation is a minimum (tRCD), this increase in voltage of digit line 52 greatly reduces the sense amp ability to sense and fully separate the digit lines. The smaller the differential, the slower the digits will sense (i.e. slow tRCD). As the digit lines reach greater separation, this becomes less of an issue. When the digits are dumped onto the IO lines, the digit lines have a greater separation and the effect is minimized. Thus, the IOPU and GCOL timing are extremely critical at the min tRCD case. Any overlap between IOPU and GCOL causes tRCD to slow down. Once the digits have separated fully, some overlap will have substantially no effect since the sense amps are fully on and the digit lines are at full rail.

Therefore, there exists a need to minimize tRCD while allowing the requisite unimpeded digit line separation to achieve accurate reading of all bits in a READ/WRITE operation.

SUMMARY OF THE INVENTION

The present invention provides a method and apparatus for improving parameter tRCD that overcomes the aforementioned digit line separation problems.

In accordance with one aspect of the invention, a method of improving digit line pair separation during a read function in a memory device is disclosed. The method includes the steps of providing an input/output data communication line equilibrating signal for equilibrating input/output data communication lines, and pre-charging a digit line pair. The method includes, upon the firing of a column access signal during the read function, firing a signal to pull down the input/output equilibrating signal logically low in order to allow the digit line pair to separate without sharing charge from the input/output data communication lines during the read function.

In accordance with another aspect of the invention, a method of operating a memory device includes the steps of providing a clock signal, and performing equilibrate and pre-charge operations on input/output data communication lines in preparation for a memory cell access operation. The method includes initiating an active command as well as a latch-setting signal, and setting a node voltage in response to the latch-setting signal to allow equilibrate and precharging operation ending signal to be initiated upon a column access signal. A read function is initiated with the column access signal, and the equilibrate and pre-charge operation ending signal is also initiated based upon the column access signal.

In yet another aspect of the invention, a method of firing signals in a read command of a memory array is disclosed, and includes firing an IO equilibrating ending signal based upon a column access signal for a first bit of a data burst, and firing the IO equilibrating ending signal based upon a clock signal for subsequent bits in the data burst.

In accordance with another aspect of the invention, a memory device includes a control register, a latch for receiving a latching signal from the control register, and logical circuitry associated with the latch. The logical circuitry will generate, upon the firing of a column access signal from the control register to the logical circuitry, a signal to stop equilibrating of an input/output (IO) line to allow separation of a logical high digit line signal and a logical low digit line signal.

The method and apparatus associated with the present invention are usable for read functions in a memory device.

Various other features, objects and advantages of the present invention will be made apparent from the following detailed description and the drawings.

BRIEF DESCRIPTION OF THE DRAWINGS

The drawings illustrate one embodiment of the best mode presently contemplated for carrying out the invention.

In the drawings.

DETAILED DESCRIPTION OF THE PREFERRED EMBODIMENT

In the following detailed description, references are made to the accompanying drawings which illustrate specific embodiments in which the invention may be practiced. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

Figure 1:
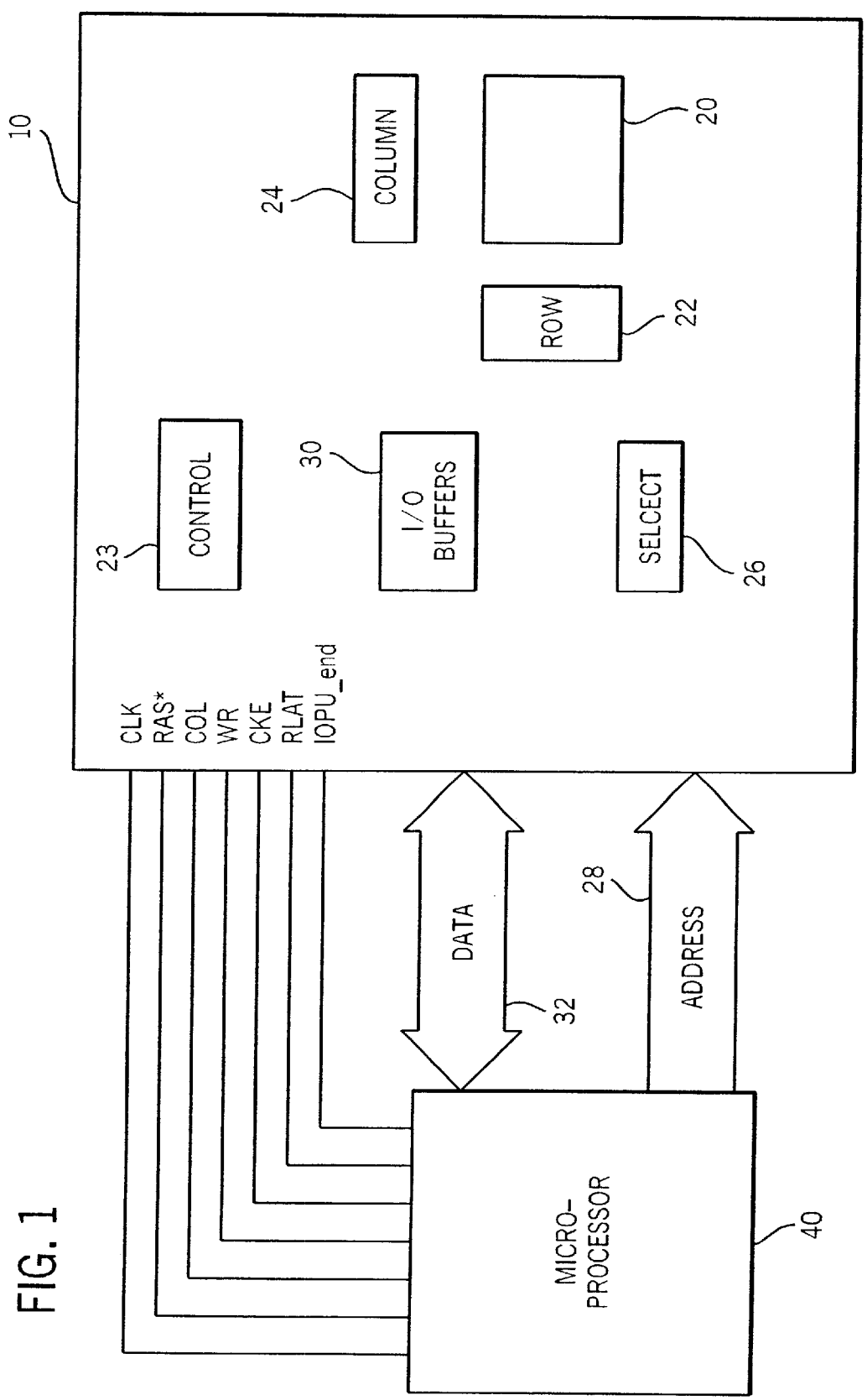
FIG. 1 is a block diagram of one embodiment of a memory device incorporating the present invention.
Figure 2:
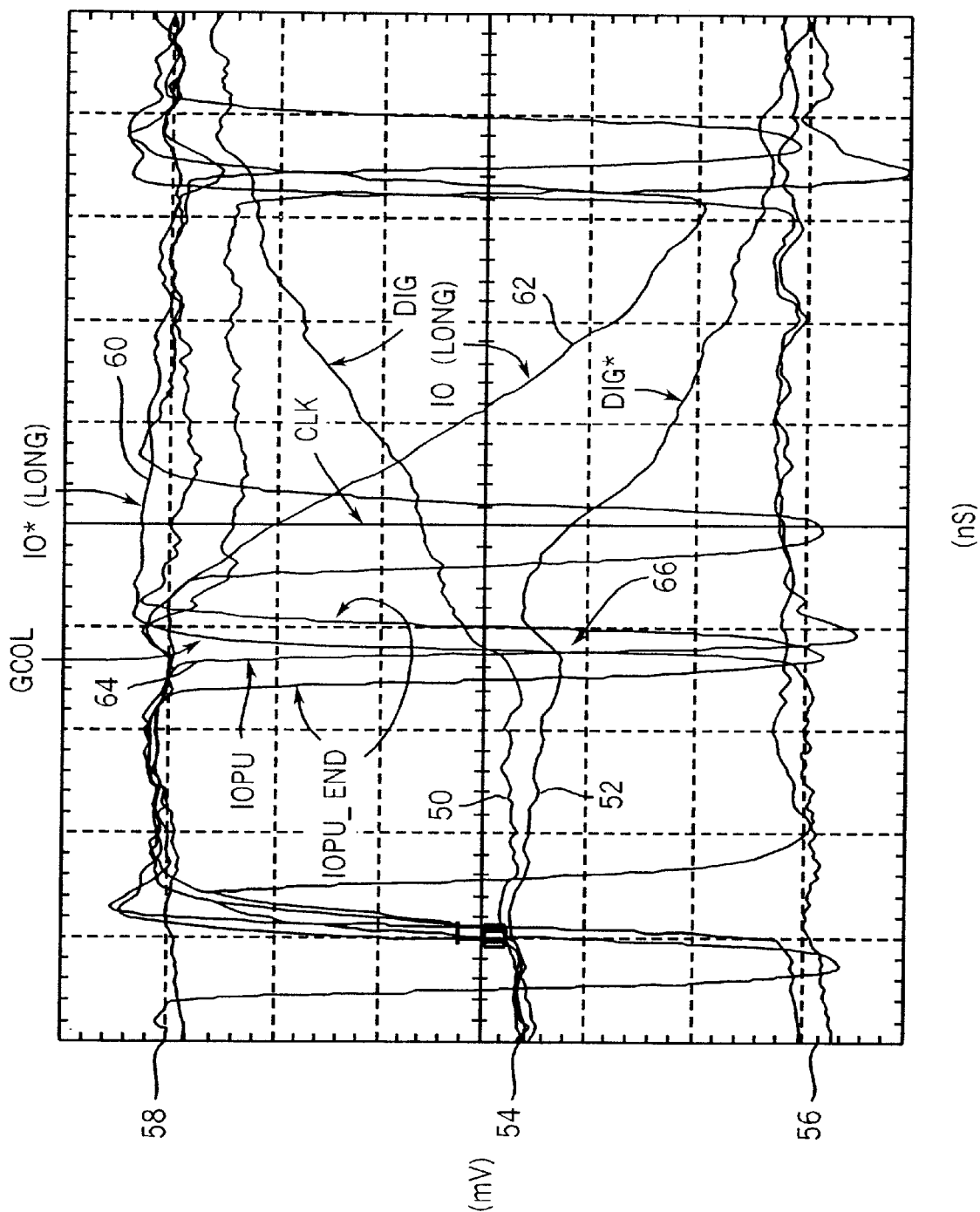
FIG. 2 is a timing diagram illustrating the digit line separation problem solved by the present invention.

FIG. 1 illustrates a memory device 10 of the present invention. The memory device 10 can be any type of memory, but is preferably an SDRAM. The SDRAM has an array of dynamic memory cells arranged in at least one addressable memory bank 20. The memory cells are accessed in response to address signals provided on address lines 28 using row 22 and column 24 decode circuitry. Input/output buffers 30 are provided for bi-directional data communication via data communication lines 32. Control circuitry 23 regulates the SDRAM operations in response to control signals which include, but are not limited to, a Clock (CLK), Row Access Strobe (RAS*), Row Latch (RLAT), Column Access Strobe (CAS* or COL), Write Enable (WE* or WR), INPUT/OUTPUT PULL UP END signal (IOPU-end) and Clock Enable (CKE). An external processor 40 is provided for both bidirectional data communication and control with the memory. The memory of FIG. 1 has been simplified for illustrating the features of the present invention and is not intended to describe all of the elements and features of an SDRAM. For a more detailed description of the operation of an SDRAM, see U.S. Pat. No. 5,751,656, assigned to Micron Technologies, Inc. of Boise, Id.

Figure 3:
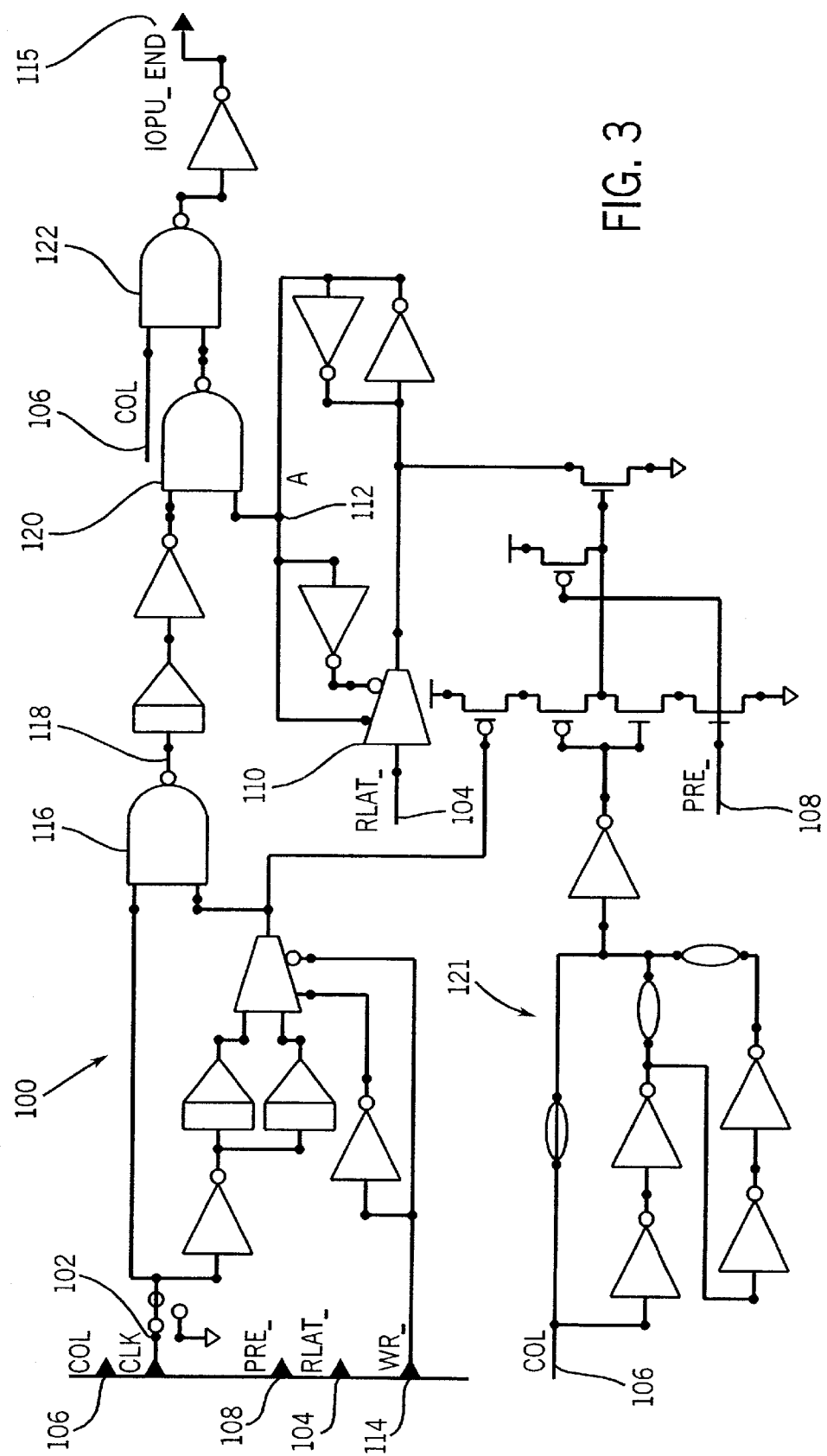
FIG. 3 is a circuit diagram illustrating the operation of one embodiment of the present invention.

FIG. 3 is one embodiment of a control circuit for use in the memory device of the present invention. Control circuit 100 receives input signals including clock (CLK) 102, latching signal (RLAT) 104, column access signal (COL) 106, pre-charge (or IOPU signal) 108. Upon a CLK signal 102 of an active command, RLAT signal 104 is pulsed to set latch 110. The setting of the latch 110 sends node voltage A to a logical low level. In starting a READ/WRITE function, WRITE signal 114 is fired along with COL signal 106. The WRITE signal 114 along with CLK signal 102 is input into nandgate (NAND) 116. The output 118 of NAND gate 116 is ultimately used as the input to nandgate 120 along with node A 112. A high column signal 106 along with a CLK signal 102 will provide a high column signal 106 into NAND gate 121 forcing IOPU end high. Because of the delay circuitry 122, the firing of a column signal 106 ultimately will reach node A after a brief delay 112 and upon the next clock pulse, will force node A 112 high. Upon the falling edge of the CLK signal to low, with node A 112 high, IOPU-end 115 will thereafter rise and fall based upon CLK pulse 102 until a new data burst occurs during a new READ/WRITE command after a new active command has occurred.

Figure 4:
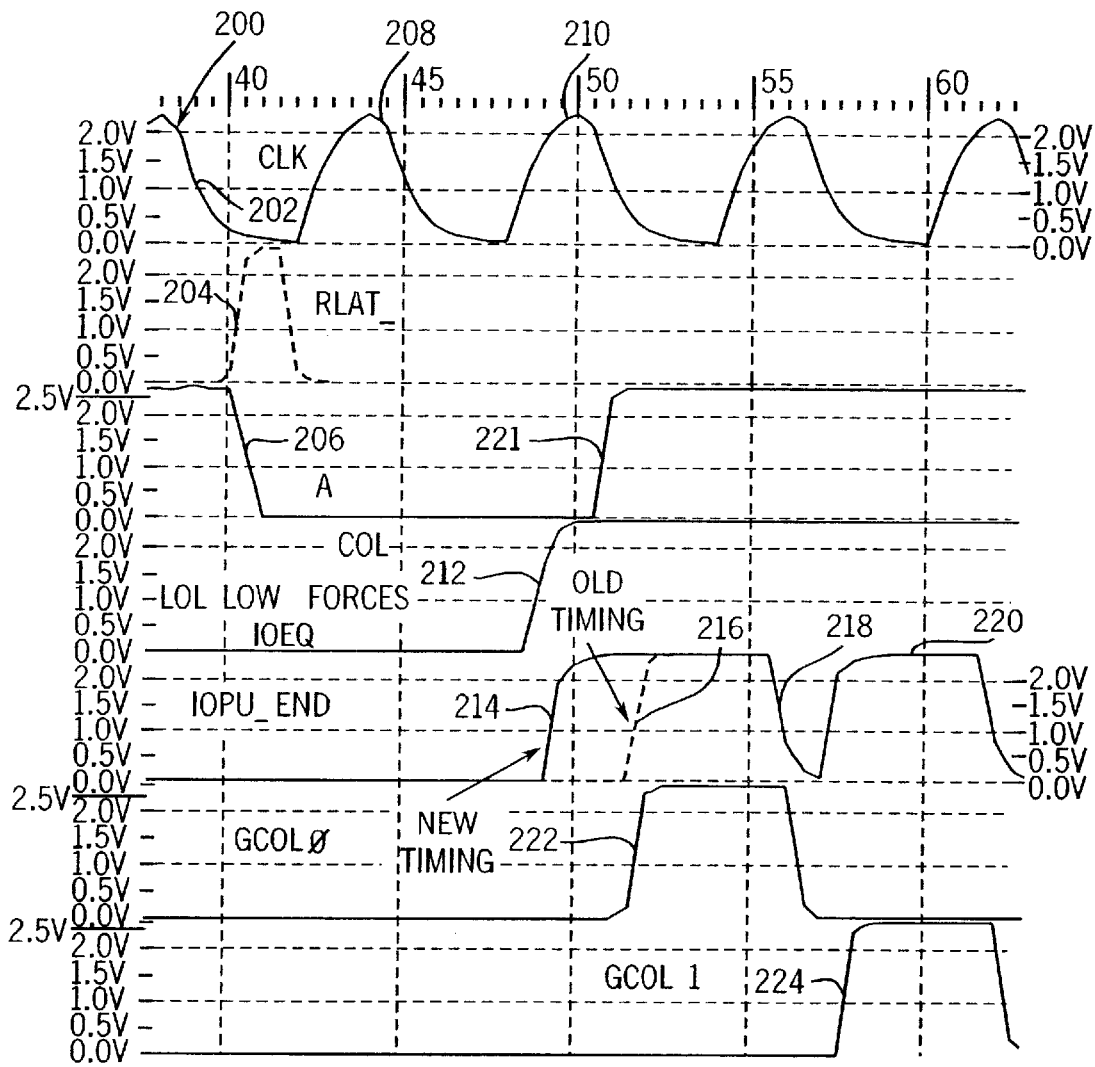
FIG. 4 is a timing diagram illustrating the timing sequence and firings of signals generated in the circuit of FIG. 3.

FIG. 4 illustrates a timing diagram in accordance with the present invention. The present invention utilizes a conventional clock signal (CLK) 200. FIG. 4 shows five clock cycles of memory device 10. The timing diagram is given in terms of a READ operation. An active command is initiated during CLK cycle 202. Upon completion of CLK cycle 202, RLAT signal 204 is pulsed in order to set latch 110 (of FIG. 103). Simultaneously, node voltage A signal 206 falls, corresponding to node voltage 112 of FIG. 3. CLK pulse 208 corresponds to a no operation or NOP and all voltage levels remain as they are. However, upon the next CLK pulse 210, corresponding to a READ cycle, column signal 212 (COL) goes high, and because node voltage A signal 206 is correspondingly low, IOPU-END signal 214 will go high and follow the COL signal 212. This is significant because IOPU-END signal 214 ends the pull-up of the IO lines, and therefore equilibration of the IO lines ceases approximately nanoseconds earlier because IOPU-END signal 214 does not have to wait for the falling edge of CLK pulse 210, but may follow COL signal 212. Previously, IOPU-END signal 214 would follow a timing as indicated by signal 216. One skilled in the art will recognize that such a savings and the ability to discontinue pull-up of the IO lines can result in significant savings to operating parameters such as tRCD as well as the ability of the digit lines to separate faster and for data to be more accurately read. Typically, the present invention contemplates saving approximately 1.5 nanoseconds from the old timing 216 to the new timing 214 of IOPU-END. This corresponds to a savings in tRCD of approximately 0.5 nanoseconds from the typical tRCD of 14 to 15 nanoseconds. Also noted is that the falling edge 218 of IOPU-END as well as the next IOPU-END pulse 220 does not have to change for the second, third and subsequent bits being read during the data burst. Upon the falling edge of CLK pulse 210, the latch is reset and node voltage A signal 206 again goes high to await the next RLAT signal 204. In a conventional manner, global column zero signal 222 and global column one signal 224 are selected to determine which set of digit lines are selected for the IO lines.

The present embodiment, through the use of IOPU-END pulse 220, forces IOEQ, or the input/output equilibrating and pre-charging signal, off for a far side IOEQ. However, the present invention contemplates that a similar process may be implemented to force both far side and near side drivers to force IOEQ off. Additionally, another embodiment although not specifically shown may include utilizing a near side driver to equilibrate and pre-charge the input/output lines.

Figure 5:
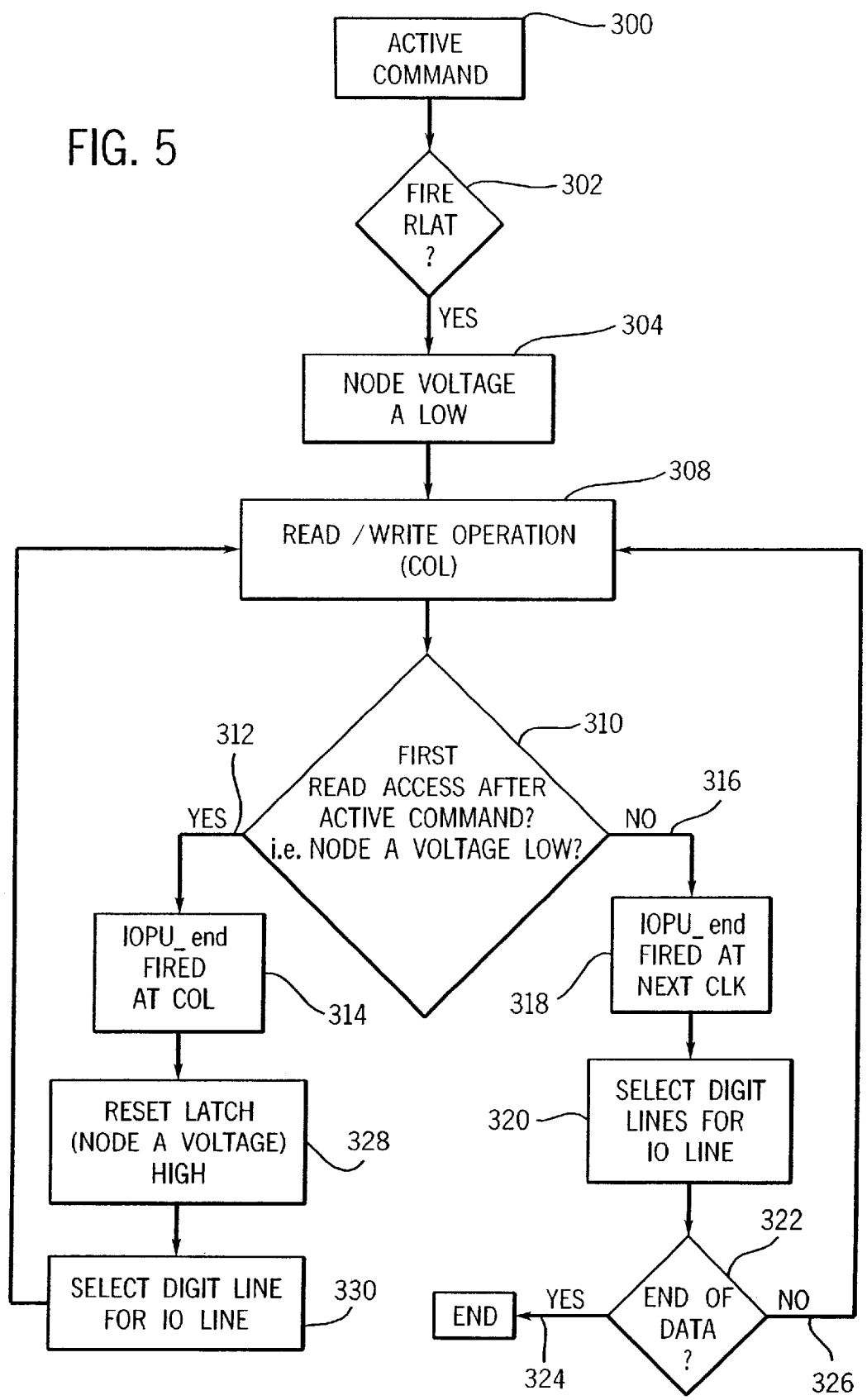
FIG. 5 is a flowchart illustrating the methodology associated with one aspect of the present invention.
Figure 3:
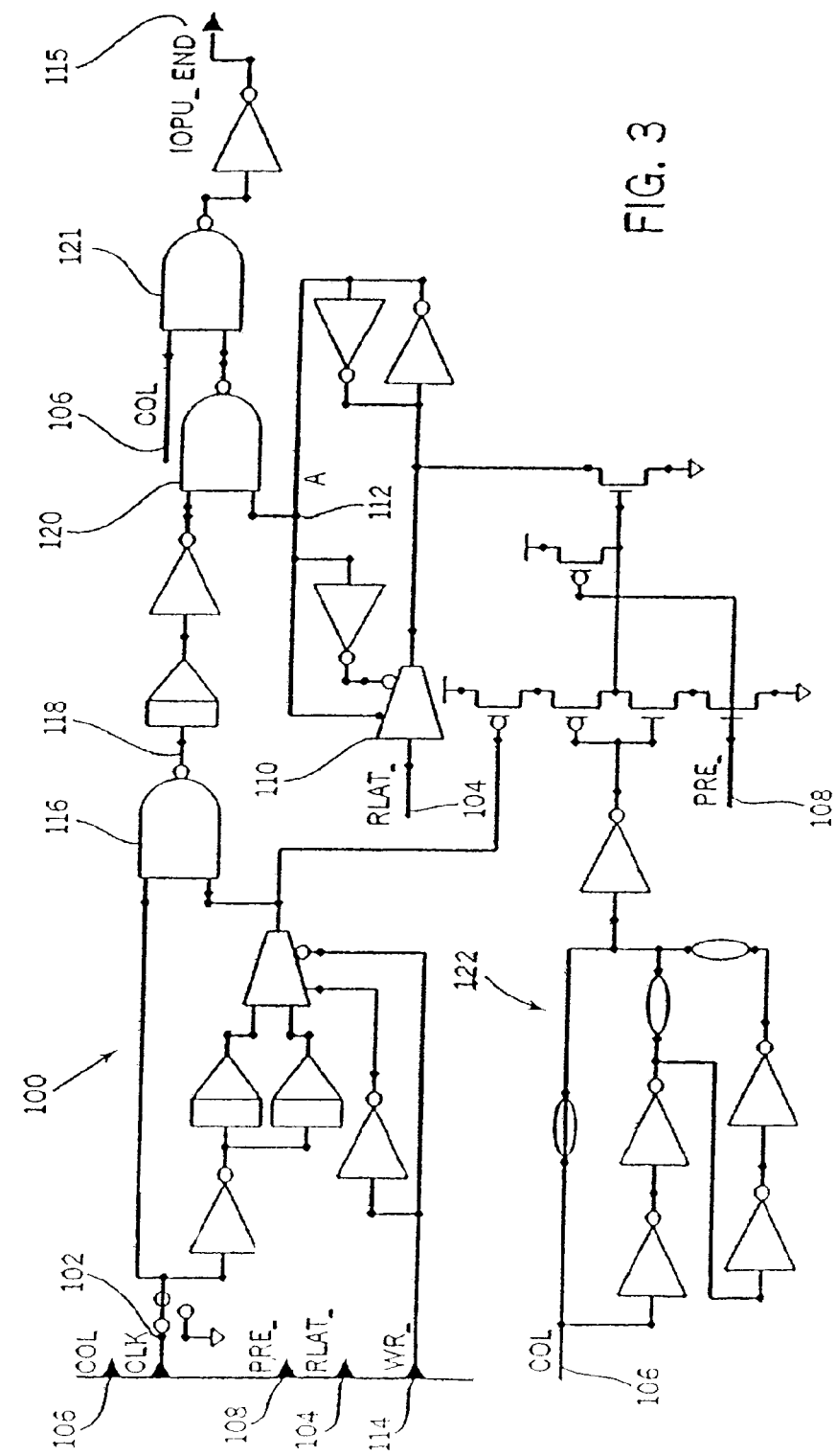

FIG. 5 illustrates a block diagram of the methodology associated with the present invention. An active command is given at step 300. At step 302, latch RLAT signal is fired in order to set RLAT, and node voltage A is pulled low at step 304. It is important to note that RLAT is only fired once after the active command has been given, until a new active command is given. READ/WRITE operation begins 308, which also occurs after node voltage A is set low at step 304. Upon the beginning of a READ/WRITE operation indicated by the firing of COL at step 308, it is determined whether the data is from the first read access after an active command, which is indicated by the low node A voltage 310. If so 312, IOPU-END is fired upon firing of the COL signal, and if it is not the first read access after the active command, 316, IOPU-END will be fired upon the next CLK signal at step 318. This is followed by selecting the digit line for the IO line dump at step 320, after which a determination is made 322 as to whether it is the end of the data burst, if so 324, it is the end of the READ cycle and if not 326, another bit is read. If IOPU-END is fired at the COL firing 314, node voltage A is set high which resets the latch at step 328, and again digit lines are selected for the IO line at step 330 and another bit is read.

The present invention has been described in terms of the preferred embodiment, and it is recognized that equivalents, alternatives, and modifications, aside from those expressly stated, are possible. The principles of the present invention, which have been disclosed by way of the above examples and discussion, can be implemented using various circuit types and arrangements. The optimization circuitry and switches, for instance, can be implemented using a variety of logic components, delays or switches that enable the optimization of a memory access operation by compensating the optimized yet time-limited components with other time components having extra available time in the synchronous memory device. Furthermore, the present invention can be utilized with different signals, for a variety of memory access operations, and other latencies. The various signals used to enable and disable the operation of certain signals, of course, can be connected at different points along the signal paths. Those skilled in the art will readily recognize that these and various other modifications and changes may be made to the present invention without strictly following the exemplary application illustrated and described herein and without departing from the true spirit and scope of the present invention, which is set forth in the following claims.

What is claimed is:

1. A memory device comprising:
   means for firing an IO equilibrating ending signal based upon a column access signal for a first bit of a data burst; and
   means for firing the IO equilibrating ending signal based upon a clock signal for subsequent bits in the data burst.

2. The memory device of claim 1 wherein the memory device is a SDRAM.

3. A memory device comprising:
   means for firing an IO equilibrating ending signal based upon a column access signal for a first bit of a data burst of a read command; and
   means for firing the IO equilibrating ending signal based upon a clock signal for subsequent bits in the data burst.

4. The memory device of claim 3 wherein the memory device is a SDRAM.

5. A memory device comprising:
   means for firing an IO equilibrating ending signal based upon a column access signal for a first bit of a data burst of a write command; and
   means for firing the IO equilibrating ending signal based upon a clock signal for subsequent bits in the data burst.

6. The memory device of claim 5 wherein the memory device is a SDRAM.

7. A synchronous dynamic random access memory (SDRAM) device comprising:
   a circuit, the circuit receiving an IO equilibrating ending signal, wherein the IO equilibrating ending signal is fired based upon a column access signal for a first bit of a data burst, and wherein the IO equilibrating ending signal is fired based upon a clock signal for subsequent bits in the data burst.

8. A system comprising:
   a microprocessor; and
   a memory device in electrical connection to the microprocessor, the memory device receiving from the microprocessor an IO equilibrating ending signal, wherein the IO equilibrating ending signal is fired based upon a column access signal for a first bit of a data burst, and wherein the IO equilibrating ending signal is fired based upon a clock signal for subsequent bits in the data burst.

9. The system of claim 8 wherein the memory device is a SDRAM.

10. A system comprising:
    a microprocessor; and
    a memory device in electrical connection to the microprocessor, the memory device receiving from the microprocessor an IO equilibrating ending signal, wherein the IO equilibrating ending signal is fired based upon a column access signal for a first bit of a data burst in a read command, and wherein the IO equilibrating ending signal is fired based upon a clock signal for subsequent bits in the data burst.

11. The system of claim 10 wherein the memory device is a SDRAM.

12. A system comprising:
    a microprocessor; and
    a memory device in electrical connection to the microprocessor, the memory device receiving from the microprocessor an IO equilibrating ending signal, wherein the IO equilibrating ending signal is fired based upon a column access signal for a first bit of a data burst in a write command, and wherein the IO equilibrating ending signal is fired based upon a clock signal for subsequent bits in the data burst.

13. The combination of claim 12 wherein the memory device is a SDRAM.

14. A memory device in combination with a microprocessor comprising:
    a circuit, the circuit receiving an IO equilibrating ending signal from the microprocessor, wherein the IO equilibrating ending signal is fired based upon a column access signal for a first bit of a data burst, and wherein the IO equilibrating ending signal is fired based upon a clock signal for subsequent bits in the data burst.

15. The combination of claim 14 wherein the memory device is a SDRAM.

16. A method of firing signals for a memory device, comprising: initially firing an IO equilibrating ending signal based upon a column access signal, and subsequently firing the IO equilibrating ending signal based upon a clock signal.

17. The method of claim 16 wherein the memory device is a SDRAM.

18. A method for firing an IO equilibrating ending signal based upon various bits of data from a data burst, comprising:
    for a first bit of a data burst, firing an IO equilibrating ending signal based upon a column access signal; and
    for one or more subsequent bits of the data burst, firing the IO equilibrating ending signal based upon a clock signal.

19. The method of claim 18 wherein the memory device is a SDRAM.

* * * * *

UNITED STATES PATENT AND TRADEMARK OFFICE
CERTIFICATE OF CORRECTION

PATENT NO. : 6,687,176 B2
DATED : February 3, 2004
INVENTOR(S) : Brendan N. Protzman et al.

It is certified that error appears in the above-identified patent and that said Letters Patent is hereby corrected as shown below:

Drawings,
Sheet 3 of 5, replace FIG. 3 with attached FIG. 3.

Column 4,
Line 1, replace "(or IOPU signal)" with -- (or IOPU) signal --.
Line 10, delete "will provide a high column signal 106" and replace it with -- is input --.
Line 11, delete "forcing IOPU end high" and replace it with -- to force IOPU_END 115 high --.
Line 13, insert -- 112 -- after "A" and delete "112" after "delay".
Line 15, replace "IOPU-end" with -- IOPU_END --.

Signed and Sealed this

Sixth Day of April, 2004

JON W. DUDAS
*Acting Director of the United States Patent and Trademark Office*